(12) United States Patent
Kuwahara et al.

(10) Patent No.: US 7,754,274 B2
(45) Date of Patent: Jul. 13, 2010

(54) MASK AND METHOD FOR MANUFACTURING THE SAME, METHOD FOR MANUFACTURING DISPLAY, METHOD FOR MANUFACTURING ORGANIC ELECTROLUMINESCENT DISPLAY, ORGANIC ELECTROLUMINESCENT DEVICE, AND ELECTRONIC DEVICE

(75) Inventors: Takayuki Kuwahara, Suwa (JP); Shinichi Yotsuya, Chino (JP)

(73) Assignee: Seiko Epson Corporation (JP)

( * ) Notice: Subject to any disclaimer, the term of this patent is extended or adjusted under 35 U.S.C. 154(b) by 1195 days.

(21) Appl. No.: 10/985,671

(22) Filed: Nov. 11, 2004

(65) Prior Publication Data
US 2005/0123676 A1   Jun. 9, 2005

(30) Foreign Application Priority Data
Nov. 17, 2003   (JP) ............................... 2003-386511

(51) Int. Cl.
*B05D 5/12* (2006.01)
*C23C 16/00* (2006.01)

(52) U.S. Cl. .............................. 427/66; 427/58; 427/64; 427/248.1; 118/715; 118/720; 118/721

(58) Field of Classification Search ................. 118/504, 118/720, 721, 722; 427/66; 156/345.3
See application file for complete search history.

(56) References Cited

U.S. PATENT DOCUMENTS

| | | | | |
|---|---|---|---|---|
| 5,811,177 A | * | 9/1998 | Shi et al. ...................... | 428/209 |
| 5,929,562 A | * | 7/1999 | Pichler ........................ | 313/506 |
| 6,255,775 B1 | * | 7/2001 | Ikuko et al. .................. | 313/506 |
| 6,459,193 B1 | * | 10/2002 | Fukuzawa et al. ........... | 313/402 |
| 2002/0111035 A1 | * | 8/2002 | Atobe et al. ................. | 438/753 |
| 2002/0125824 A1 | | 9/2002 | Fukuzawa | |
| 2002/0197393 A1 | * | 12/2002 | Kuwabara ..................... | 427/66 |
| 2003/0010749 A1 | * | 1/2003 | Yoshizawa et al. ............ | 216/56 |
| 2003/0054646 A1 | * | 3/2003 | Yotsuya ....................... | 438/689 |
| 2003/0059690 A1 | * | 3/2003 | Yotsuya ......................... | 430/5 |
| 2003/0221613 A1 | * | 12/2003 | Kang et al. .................. | 118/504 |

FOREIGN PATENT DOCUMENTS

JP          63-070257        3/1988

(Continued)

OTHER PUBLICATIONS

A. Tixler, et al., A Silicon Shadow Mask for Deposition on Isolated Areas, 2000, p. 157-162.

(Continued)

*Primary Examiner*—Michael Cleveland
*Assistant Examiner*—Michael Wieczorek
(74) *Attorney, Agent, or Firm*—Harness, Dickey & Pierce, P.L.C.

(57) ABSTRACT

A mask includes a substrate which includes a front side and a back side and is provided with through-holes; and a film which adjusts a shape of the substrate provided above at least one of the front side and the back side of the substrate. A method of manufacturing a mask includes the steps of: providing a substrate having a front side and a back side; forming a film which adjusts a shape of the substrate above at least one of the front side and the back side of the substrate; and drilling through-holes in the substrate.

9 Claims, 7 Drawing Sheets

FOREIGN PATENT DOCUMENTS

| | | |
|---|---|---|
| JP | 63-175860 | 7/1988 |
| JP | 02-135359 | 5/1990 |
| JP | 02-135361 | 5/1990 |
| JP | 02-209988 | 8/1990 |
| JP | 03-037992 | 2/1991 |
| JP | 03-152184 | 6/1991 |
| JP | 2001-093667 | 4/2001 |
| JP | 2001-185350 | 7/2001 |
| JP | 2002-047560 | 2/2002 |
| JP | 2003-100460 | 4/2003 |
| JP | 2003-308972 | 10/2003 |

OTHER PUBLICATIONS

G.M. Kim, et al., Fabrication and Application of a Full Wafer Size Micro/Nanostencil for Multiple Length-Scale Surface Patterning, 2003, p. 609-614.

Frank-Michael Kamm, Influence of Silicon on Insulator Wafer Stress Properties on Placement Accuracy of Stencil Masks, 2002 pp. 4146-4149.

Communication from European Patent Office regarding counterpart application, Date: Feb. 14, 2006.

* cited by examiner

MASK AND METHOD FOR MANUFACTURING THE SAME, METHOD FOR MANUFACTURING DISPLAY, METHOD FOR MANUFACTURING ORGANIC ELECTROLUMINESCENT DISPLAY, ORGANIC ELECTROLUMINESCENT DEVICE, AND ELECTRONIC DEVICE

BACKGROUND OF THE INVENTION

1. Field of the Invention

The present invention relates to a mask and a method for manufacturing a mask, to a method for manufacturing a display, to a method for manufacturing an organic electroluminescent display, to an organic electroluminescent device, and to an electronic device.

Priority is claimed on Japanese Patent Application No. 2003-386511, filed Nov. 17, 2003, the content of which is incorporated herein by reference.

2. Description of Related Art

In a manufacturing process of low molecular fill-color organic EL (electroluminescent) displays, for example, masks are used to pattern pixels of the display by evaporating organic materials for forming pixels of various colors. Japanese Unexamined Patent Applications, First Publication Nos. 2001-93667 and 2001-185350 disclose one example of a technology for patterning pixels by evaporating organic materials forming pixels of various colors.

The methodology disclosed in Japanese Unexamined Patent Application, First Publication No. 2001-93667 uses a metal mask as a mask, and the materials to be evaporated are evaporated and deposited on a glass substrate, i.e., evaporation object (an object on which a material is evaporated), while making the metal mask to come in a close contact with the glass substrate using a permanent magnet. As the size of the metal mask increases with an increase in the size of a glass substrate, the difference in the coefficient of linear expansion between the metal mask and the glass substrate becomes significant. As a result, misalignment between through-holes (openings) provided in the metal mask and the evaporation object may occur, especially at the edges of the glass substrate. On the other hand, the methodology disclosed in Japanese Unexamined Patent Application, First Publication No. 2001-185350 uses a silicon mask as a mask, and the difference in the coefficient of linear expansion between the mask and a substrate is smaller compared to the metal mask in this technique. However, the glass substrate cannot be made to come in a close contact with the silicon mask without a permanent magnet. Furthermore, as the sizes of the silicon mask and the glass substrate increase, the bending deformations (distortion deformation) of the silicon mask and the glass substrate become significant. As a result, it may be difficult to make the silicon mask come in a close contact with the glass substrate during evaporation, and evaporated particles (evaporation materials) which pass trough the through-holes provided in the silicon mask may reach the space between the silicon mask and the glass substrate, which makes a precise patterning difficult.

SUMMARY OF THE INVENTION

The present invention was conceived in view of the above-described background, and an object thereof is to provide a mask and a method for manufacturing a mask which can allow a precise patterning while reducing the effect of the deformation of a substrate and an evaporation object during patterning using a mask provided with through-holes. Another object of the present invention is to provide a method for manufacturing a display using the mask, a method for manufacturing an organic electroluminescent display, an organic electroluminescent device, and an electronic device.

In order to solve the above-described problem, the mask according to the present invention includes a substrate which includes a front side and a back side and is provided with through-holes; and a film which adjusts a shape of the substrate provided above at least one of the front side and the back side of the substrate.

According to the present invention, since the film for adjusting the shape of the substrate is provided above at least one side of the substrate which is a base material of the mask, the shape of the substrate can be adjusted according to the shape of evaporation object, allowing the mask to come in a close contact with the evaporation object. Accordingly, even when the sizes of an evaporation object and a mask increase, an evaporation material can be precisely patterned on the evaporation object while reducing the effects of deformation of the evaporation object and the mask and the like.

According to the mask of the present invention, the film adjusts the bending deformation of the substrate by applying a stress to the substrate.

The film provided above the substrate can apply a stress (tension stress or compressive stress) to the substrate to the direction of the bending. This enables correction of the bending deformation (distortion deformation) and ensures a close contact between the mask and the evaporation object even when the size of the mask increases and the bending deformation becomes significant due to an increase in its own weight and the like.

According to the mask of the present invention, a plurality of through-holes are provided in a predetermined pattern in the substrate, and the film is provided according to the predetermined pattern of the through-holes.

As the position, the size, and the like of the through-holes provided in the mask vary, the bending deformation of the mask (and/or the substrate) may vary accordingly. The bending deformation of the mask, however, can be satisfactorily corrected by providing a film according to the position, the size, and the like of the through-holes provided in the mask. Accordingly, the flexibility of the design of the position, the size, and the like of the through-holes provided in the mask is enhanced, and a material can be evaporating while making the mask come in a close contact with the evaporation object.

According to the mask of the present invention, the film is patterned according to a target shape of the substrate.

The film is patterned according to the target shape of the substrate (mask) which is selected based on the shape of the evaporation object. Thus, it becomes possible to fabricate a mask which applies the stress (bending stress) to the substrate according to the film pattern provided thereon, and has a shape which conforms with the evaporation object.

In the mask of the present invention, a thickness profile of the film is selected according to the target shape of the substrate.

The thickness profile of film is selected according to the target shape of the substrate (mask) which is selected based on the shape of the evaporation object. Thus, it becomes possible to fabricate a mask which applies the stress (bending stress) to the substrate according to the thickness profile of film, and has a shape which conforms with the evaporation object.

In the mask of the present invention, the film includes a first film pattern which extends to a first direction on a surface of the substrate, and a second film which extends to a second direction which is orthogonal to the first direction.

For example, if the mask has a rectangular shape, the bending deformation with respect to the first direction on a surface of the substrate, and the bending deformation with respect to the second direction which is orthogonal to the first direction may become significant. However, such a bending deformation can be corrected by applying a stress to the mask in the direction of the bending by providing a film which extends according to the direction of the bending deformation.

A method of manufacturing a mask according to the present invention includes the steps of: providing a substrate having a front side and a back side; forming a film which adjusts a shape of the substrate above at least one of the front side and the back side of the substrate; and drilling through-holes in the substrate.

According to the present invention, since the film for adjusting the shape of the substrate is provided above at least one side of the substrate which is a base material of the mask, the shape of the substrate can be adjusted so that the shape of the film conforms with the shape of an evaporation object, allowing the mask to come in a close contact with the evaporation object. Accordingly, even when the size of an evaporation object and a mask increases, an evaporation material can be precisely patterned on the evaporation object while reducing the effects of deformation of the evaporation object and the mask and the like. In particular, by providing the film before providing the through-holes in the substrate, the step of forming the film can be smoothly carried out using various film-forming methods, such as a spin-coating, without being affected by the through-holes.

The method for manufacturing a mask according to the present invention further includes the step of patterning the film which has been provided in the step of forming a film before the step of drilling through-holes in the substrate.

By patterning the film before providing the through-holes in the substrate, the step of patterning the film can be smoothly carried out without being affected by the through-holes.

A method of manufacturing a mask according to the present invention includes the steps of: providing a substrate having a front side and a back side; drilling through-holes in the substrate; and forming a film which adjusts a shape of the substrate above at least one of the front side and the back side of the substrate.

Thus, the film may be provided after providing the through-holes in the substrate. In this case, the shape of the substrate can be adjusted according to the shape of evaporation object, and evaporation material can be precisely patterned on the evaporation object while allowing the mask to come in a close contact with the evaporation object.

The method for manufacturing a mask according to the present invention further includes the steps of: measuring a value indicative of a shape of the substrate which has been provided the through-holes after the step of drilling, and providing the film based on the value obtained in the step of measuring.

The state of the bending deformation of the mask (substrate) may vary depending on the position, the size, and the like of the through-holes between before and after provision of the through-holes. However, such a bending deformation of the mask can be satisfactorily corrected by measuring values indicative of the state (e.g., the shape) of the bending deformation of the substrate after the through-holes is provided, and providing the film based on the result of the measurement.

A method for manufacturing a display according to the present invention includes the steps of: providing an evaporation object; and evaporating a display formation material on the evaporation object using the mask described above.

A method for manufacturing an organic electroluminescent display according to the present invention includes the steps of: providing an evaporation object; and evaporating an organic electroluminescent display formation material on the evaporation object using the mask described above.

An organic electroluminescent according to the present invention includes an evaporation object, and an organic electroluminescent display formation material which is evaporated on the evaporation object using the mask described above.

An electronic device according to the present invention includes a display manufactured by the above-mentioned method for manufacturing a display.

According to the present invention, a high-quality display, an organic electroluminescent display, and an electronic device which include a precisely patterned pixels which are least affected by the deformation of the mask and the evaporation object, and exhibit an excellent display performance can be provided.

DETAILED DESCRIPTION OF THE INVENTION

Hereinafter, one embodiment of a method for manufacturing a mask according to the present invention will be explained with reference to FIG. 1.

FIGS. 1A to 1E schematically illustrate a process for manufacturing the mask according to the present invention.

Figure 1A:
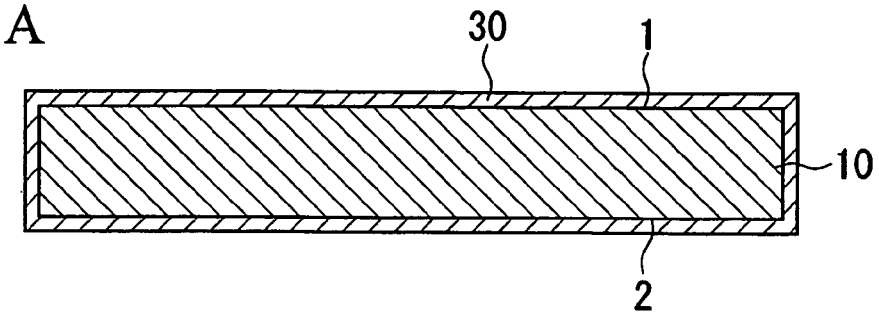
FIGS. 1A to 1E illustrate an embodiment of a method for manufacturing a mask according to the present invention.

First, a substrate 10 which is a base material of a mask M is provided as shown in FIG. 1A. The substrate 10 is made of silicon (Si), and more specifically is made of single crystal silicon (single crystal Si). In this embodiment, a first side (i.e., front side) 1 and a second side (i.e., back side) 2 of the silicon substrate 10 are surfaces having a Miller index of (100).

In the first step, an anti-etching film 30 is provided on the silicon substrate 10.

The anti-etching film 30 is provided on at least the first side 1 of the silicon substrate 10. It should be noted that the anti-etching film 30 may also be provided on the second side 2. In the example shown in FIG. 1A, the anti-etching film 30 is provided continuously on the entire surface of the silicon substrate 10, including the first side 1, the second side 2, and both sides. The anti-etching film 30 may be formed of silicon oxide ($SiO_2$) deposited using a thermal oxidation process, for example, wet thermal oxidation, or made of silicon nitride ($Si_3N_4$), or made of silicon carbide. Alternatively, the anti-etching film 30 may be a silicon oxide or silicon nitride film deposited using a CVD method, or may be a metal film made of gold or chrome deposited using sputtering. The anti-etching film 30 is the film of the present invention which adjusts the shape of the substrate 10, and this first step defines the step for forming a film which adjusts the shape of the substrate 10. As used herein, "the shape of the substrate" refers to a cross-sectional profile of the substrate.

Next, in the second (first patterning) step, the anti-etching film 30 which has been provided in the first step is patterned.

Figure 1B:
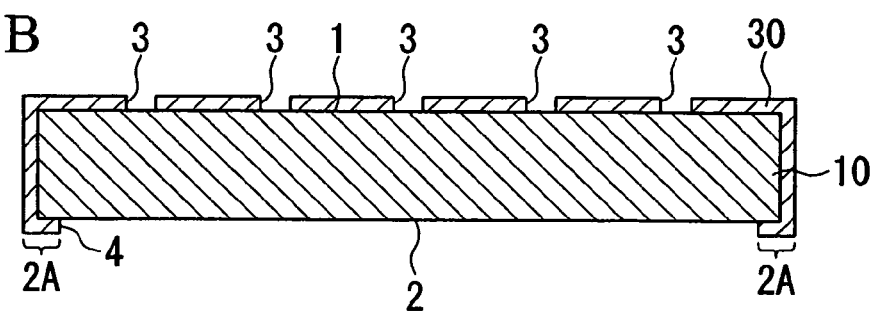

As shown in FIG. 1B, the anti-etching film 30 on the first side 1 is patterned to a predetermined pattern according to through-holes to be provided in the silicon substrate 10 which will be discussed later. As a result, the anti-etching film 30 is removed in areas in which through-holes are to be provided, and first etched openings 3 are defined. The anti-etching film 30 on the second side 2 is almost completely removed except an edge region 2A on the second side 2, and a large second etched opening 4 is defined. The silicon substrate 10 is exposed from the first and second etched openings 3 and 4. The first and second etched openings 3 and 4 may be formed using well-known photolithography and etching techniques.

Figure 1C:
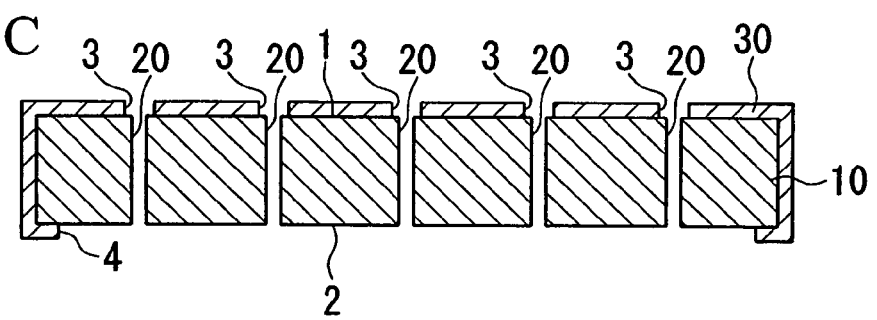

After the anti-etching film 30 is pattered, through-holes 20 are provided in the silicon substrate 10 in the third step, as shown in FIG. 1C.

The through-holes 20 penetrate both the first side 1 and the second side 2 of the silicon substrate 10, and are formed by means of laser beam machining with YAG laser or $CO_2$ laser or the like. The through-holes 20 are formed by irradiating laser light to the positions corresponding to the first etched openings 3, i.e., the exposed regions on the front side 3 of the silicon substrate 10. In this embodiment, the through-holes 20 are formed so that the diameters thereof are smaller than the diameters of the first etched openings 3, as shown in FIG. 1C. It should be noted that, as a method for providing the through-holes 20, the micro blast machining technique may be used in which minute abrasive grains are bombarded to an object in a jet blast. Alternatively, the time modulation plasma etching technique in which formation of a side wall protection film and etching are carried out alternately, or the tool machining technique using a tool, such as a drill, can be used. The second step defines the step of drilling to provide the through-holes 20 in silicon substrate 10.

After the through-holes 20 are formed in the silicon substrate 10, the first side 1 and the second side 2 of the silicon substrate 10 are etched using the anti-etching film 30 as a mask in the fourth step.

Figure 1D:
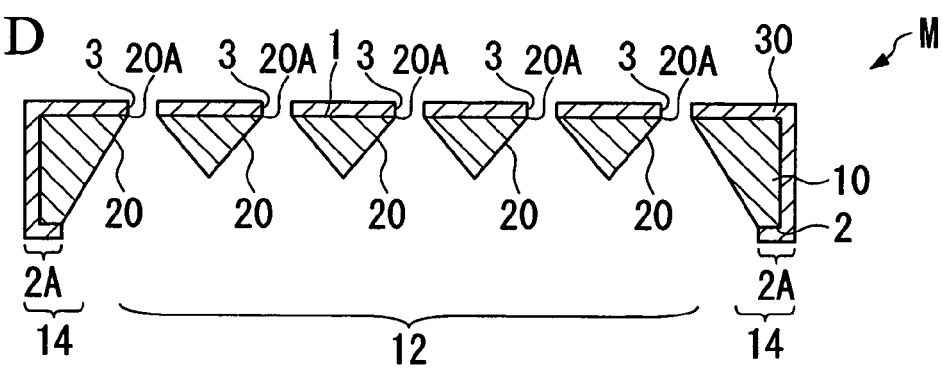

In this embodiment, crystal anisotropic etching technique is carried out. In this etching technique, the etching of the silicon substrate 10 shows a dependence on the plane orientation of silicon crystal. For example, the etch rate of the (111) plane may be lower than the etch rate of the (100) plane. In this embodiment as descried previously, since the first side 1 and the second side 2 of the silicon substrate 10 are (100) planes, the etch rate of the first side and the second side is slower than the etch rate of the (111) plane. In this case, the exposed (100) plane within the first etched openings 3 is etched on the first side 1, and the diameters of the through-holes 20 which has been formed so as to have smaller diameters than the first etched openings 3 are enlarged. The expansion of the through-holes 20 is stopped when the etching proceeds to the edge of the first etched openings 3 provided on the anti-etching film 30. In this process, the openings 20A corresponding to the first etched openings 3 are formed on the first side 1 of the silicon substrate 10. On the second side 2, the exposed (100) plane is etched in the second etched opening 4. On the second side 2, the silicon substrate 10 is also exposed in areas between adjacent through-holes 20, and the (100) plane is etched in those areas. As a result, the thickness of areas in the silicon substrate 10 other than the edge region 2A is reduced, and the thinner portion 12 is defined. The area corresponds to the edge region 2A of the silicon substrate 10, however, remains unetched, and a thicker portion 14 is defined. The etching proceeds until all of the surfaces exposed from the anti-etching film 30 on the silicon substrate 10 becomes the (111) plane. Thus, the tapered through-holes 20 are formed, the surface of the inner walls of which are the (111) plane, as shown in FIG. 1D.

The above-mentioned etching may be carried out using an organic amine alkali aqueous solution, for example, a solution containing tetramethyl ammonium hydroxide of equal to or more than 10% by weight and equal to or less than 30% by weight (in particular, between about 10% and 20% by weight) at about 80° C. Alternatively, inorganic alkali aqueous solution other than potassium hydroxide aqueous solution, for example, aqueous ammonia, may be used. By using an alkali solution not containing potassium or sodium, the contamination of the mask M during the manufacturing step thereof can be prevented. In addition, the contamination of the evaporation object (an object on which a material is evaporated) due to the mask M during the evaporation process can be prevented. It should be noted that a chemical agent containing potassium may be used for the etching. For example, a 15% potassium hydroxide solution at about 80° C. may be used.

The mask M according to the present invention has been fabricated in the process described above. In this mask, even when bending deformation (distortion deformation) occurs in the mask M, the film (anti-etching film) 30 provided on the substrate (silicon substrate) 10 corrects the bending deformation by applying a stress to the substrate 10 (mask M). Accordingly, the mask M can made come in a close contact with an evaporation object when using this mask as an evaporation mask.

Furthermore, by forming the thinner portion 12 in a part of the mask M, when an evaporation material is evaporated while making the mask M come in a close contact with the evaporation object, the areas of evaporation can be almost restricted to the areas of the openings 20A of the mask M. The taper of through-holes 20 enables a precise evaporation of the evaporation material to the evaporation object. Furthermore, the thicker portion 14 reinforces the silicon substrate 10 which has the thinner portion 12. In this mask, although the bending deformation may be significant in the thinner portion 12, the film 30 provided on the thinner portion 12 can correct the bending deformation of the substrate 10 (thinner portion 12).

In this embodiment, the film 30 is made of, for example, silicon oxide which generates a compressive stress. Instead of silicon oxide, for example, gold or chrome may be used for the film 30 in order to apply a tension stress to the substrate 10. As described previously, gold or chrome may be deposited on the substrate 10 by means of sputtering. Accordingly, either materials which generates compressive stress or materials which generates tension stress may be selected to form the film 30 according to the direction of the bending deformation in the substrate 10. The side on which the film 30 is provided is not limited to the first side (i.e., front side) 1 of the substrate 10, the film 30 may be provided to the second side (i.e., back side) 2.

Figure 1E:
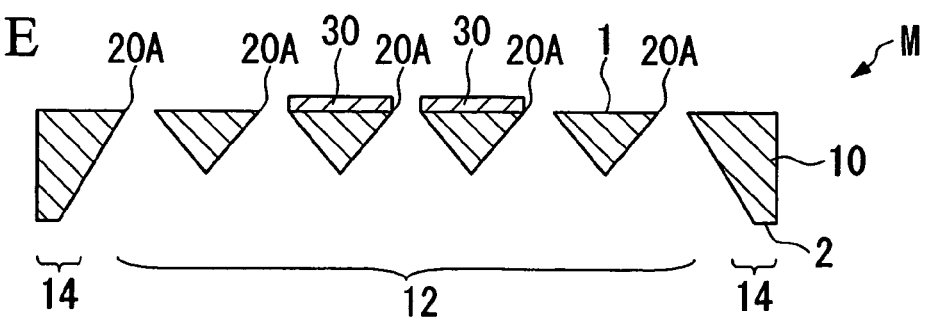

It should be noted that, as shown in FIG. 1E, the film 30, may be further patterned as required in the fifth step, which defines the second patterning step.

The film 30 may be patterned using well-known photolithography and etching techniques. That is, the upper side of the mask M shown in FIG. 1D is coated with a resist, which is then patterned by means of photolithography, and the film 30 is etched to form a desired pattern in the film 30. In this case, since the substrate 10 provided with the through-holes 20 cannot be coated with a resist using conventional coating method, such as spin-coating, electrostatic coater may preferably used in which the resist is atomizing and electric charges are provided to coat on the conductive front side.

It should be noted that before carrying out the fifth (second patterning) step, values indicative of the shape of the substrate 10 having the through-holes 20 (i.e., the substrate 10 shown in FIG. 1D), including the degree (extent) of bending deformation, may be measured. Based on the results of the measurement, the film 30 may be patterned or a film thickness profile of the film 30 may be selected. The bending deformation in the substrate 10 (mask M) may be corrected even more satisfactorily since the state of the bending deformation of the substrate 10 is measured and the film 30 for correcting the bending deformation is provided based on the results. It should be noted that values indicative of the bending deformation in the substrate 10 may be obtained using well-known measuring instruments capable of measuring the bending deformation in the substrate 10, for example, optically.

In the embodiments described above, the film 30 is patterned in the second step described above with reference to FIG. 1B which is the first patterning step, and then the through-holes are provided in the substrate 10 in the third step described above with reference to FIG. 1C. Then, as required, the film 30 is patterned to a desired pattern in the fifth step described above with reference to FIG. 1E which is the second patterning. It should be noted, however, that the film 30 may be patterned to a desired pattern, such as a cross, in the second step described above with reference to FIG. 1B. That is, the film 30 can be patterned before carrying out the step of drilling. In this case, the above-described fifth step for coating the substrate 10 having the through-holes 20 with a resist using an electrostatic coater may be omitted.

FIGS. 2 to 7 illustrate examples of the pattern of the film 30 provided on the mask M (substrate 10) after the fifth step described above with reference to FIG. 1E is completed. In the mask M, plural through-holes (openings) 20 having a rectangular shape in plan view are provided in a matrix consisting of 8 rows and 9 columns. It should be noted that each through-hole (opening) of plural through-holes (openings) 20 are arranged into a predetermined pattern according to the arrangement of pixels (stripe or delta arrangement, or the like) of a display which will be described below.

Figure 2:
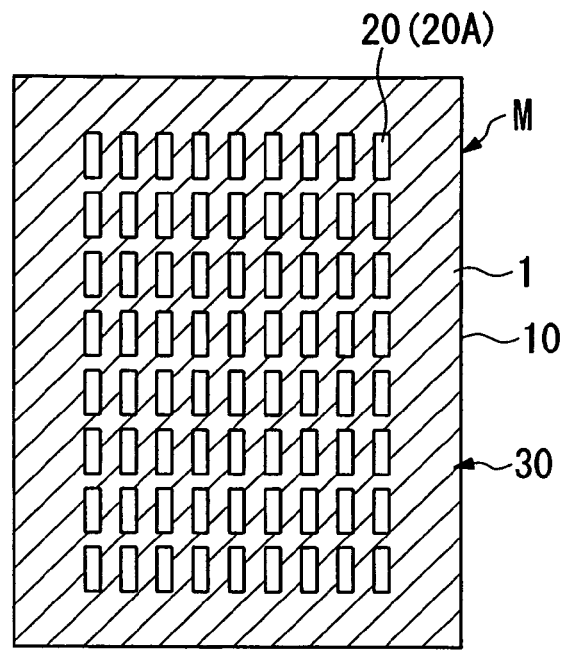
FIG. 2 is a plan view illustrating one embodiment of a mask according to the present invention.

Referring to FIG. 2, an example of the film 30 is shown in which the film 30 is provided on the entire surface of the first side 1 of the substrate 10. In other words, this mask corresponds to the mask M described above with reference to FIG. 1D.

Figure 3:
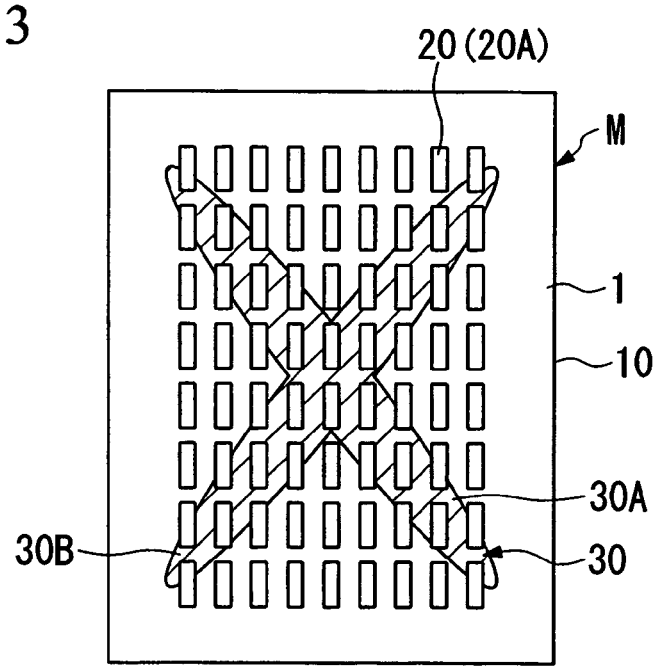
FIG. 3 is a plan view illustrating another embodiment of a mask according to the present invention.

FIG. 3 illustrates another example of the film 30 provided on a first side 1 of the substrate 10 having a rectangular shape in plan view. The film 30 has a first film pattern 30A which extends to a first diagonal direction (first direction) and a second film pattern 30B which extends to a second diagonal direction (second direction) which is orthogonal to the first diagonal direction.

Figure 4:
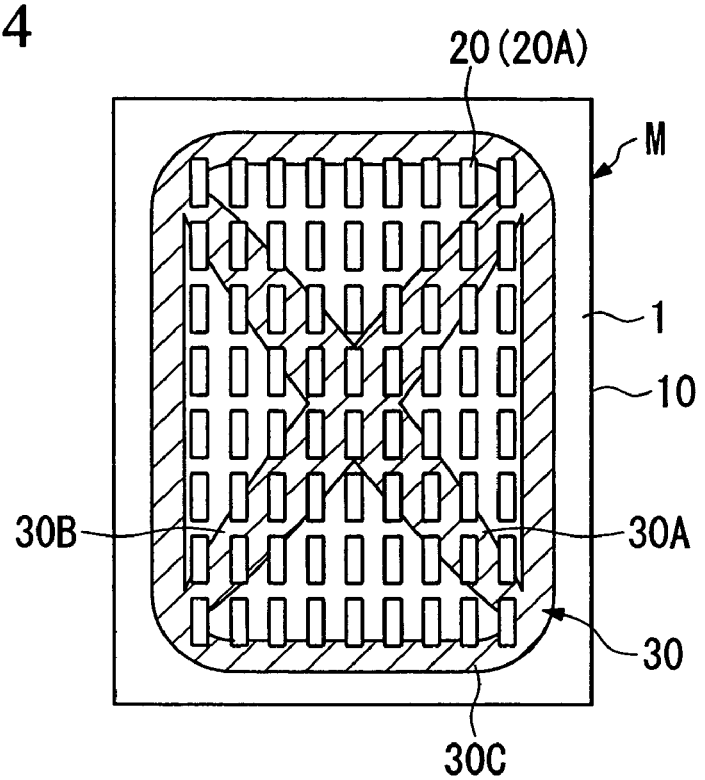
FIG. 4 is a plan view illustrating another embodiment of a mask according to the present invention.

In an example shown in FIG. 4, a frame-shaped pattern 30C is provided surrounding the first film pattern 30A and the second film pattern 30B described above with reference to FIG. 3.

Figure 5:
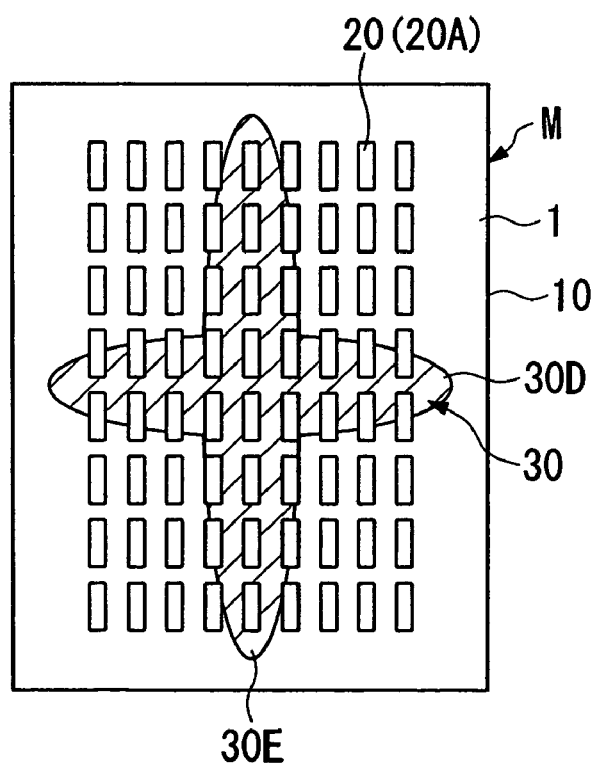
FIG. 5 is a plan view illustrating another embodiment of a mask according to the present invention.

FIG. 5 illustrates a further example of the film 30 provided on a first side 1 of the substrate 10 having a rectangular shape in plan view. The film 30 has a first film pattern 30D which extends to a short side direction (first direction) and a second film pattern 30E which extends to a longitudinal direction (second direction) which is substantially perpendicular to the first direction.

In the examples shown in FIGS. 2 to 5, if the substrate 10 has a rectangular shape, the bending deformation with respect to the first direction, and the bending deformation with respect to the second direction which is orthogonal to the first direction would be significant if the film 30 on the surface of the substrate were not provided. However, the bending deformation can be satisfactorily corrected by the film 30 which extends according to the direction of the bending deformation and applies a stress in the direction of bending to the mask M.

Figure 6:
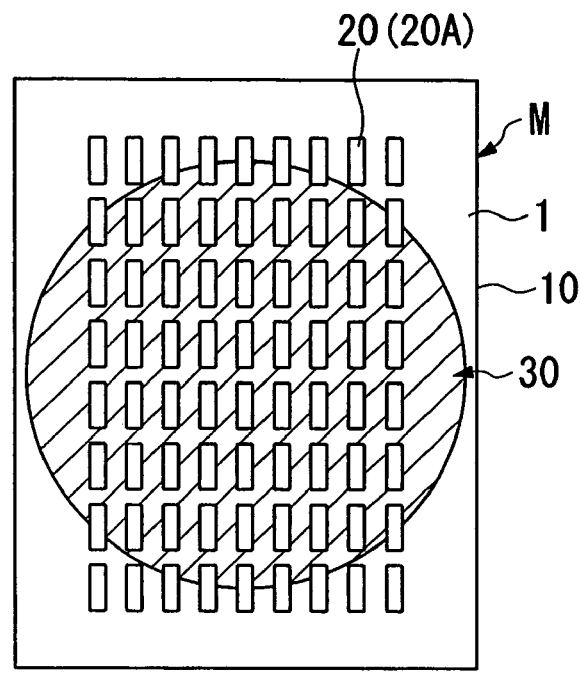
FIG. 6 is a plan view illustrating another embodiment of a mask according to the present invention.

Referring to FIG. 6, an example of the film 30 is shown in which the film 30 having a circular shape in plan view is provided substantially at the center of the substrate 10. With this pattern, a deformation which causes an inward bending at the center of the substrate 10 can be satisfactorily corrected. It should be noted that the pattern of the film 30 is not limited to the above-described examples, and any pattern can be used, provided that the pattern corrects the bending deformation of the mask M. In the embodiments described above, the film 30 may be provided on the second side 2, or may be provided on both the first side 1 and the second side 2.

Figure 7:
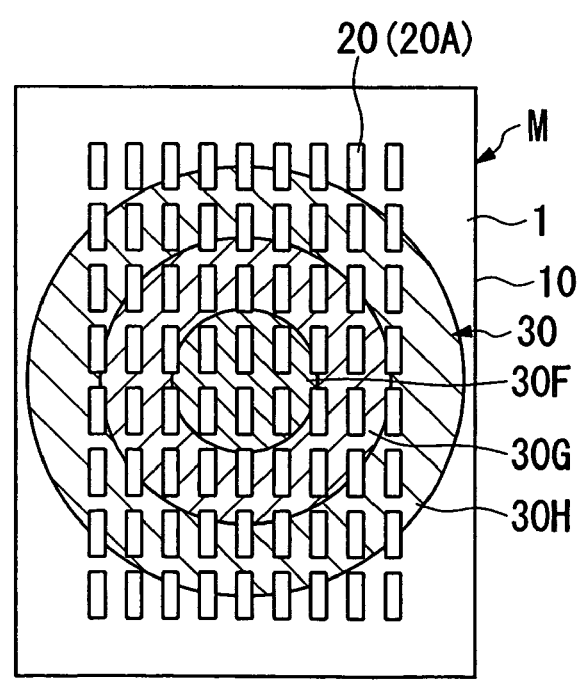
FIG. 7 is a plan view illustrating another embodiment of a mask according to the present invention.

Furthermore, as shown in FIG. 7, the bending deformation in the mask M can be corrected satisfactorily by providing a film thickness profile to the film 30. In particular, when a bending deformation which causes an inward bending of the center of the substrate 10 is present, the film may have a concentric thickness profile in which the film at the center is the thickest and the thickness gradually decreases toward the outside of the substrate. In the example shown in FIG. 7, the film thickness is the largest at a circular film pattern 30F at the center. The thickness of an annular film pattern 30G surrounding the film pattern 30F is smaller than that of the film pattern 30F, and the thickness of a film pattern 30H surrounding the film pattern 30G is smaller than that of the film pattern 30G.

The state of the bending deformation of the substrate 10 (mask M) may vary according to various factors, including the thickness the substrate 10 (mask M), the thickness profile thereof, the material of the substrate 10, an arrangement of plural through-holes (openings) 20, and size of the through-holes 20. Accordingly, as described above with reference to FIGS. 2 to 7, the film 30 may be patterned to various patterns, or the film 30 may be provided with a film thickness profile according to the state of the bending deformation, that is, according to the target shape of the substrate 10 (mask M).

Figure 8:
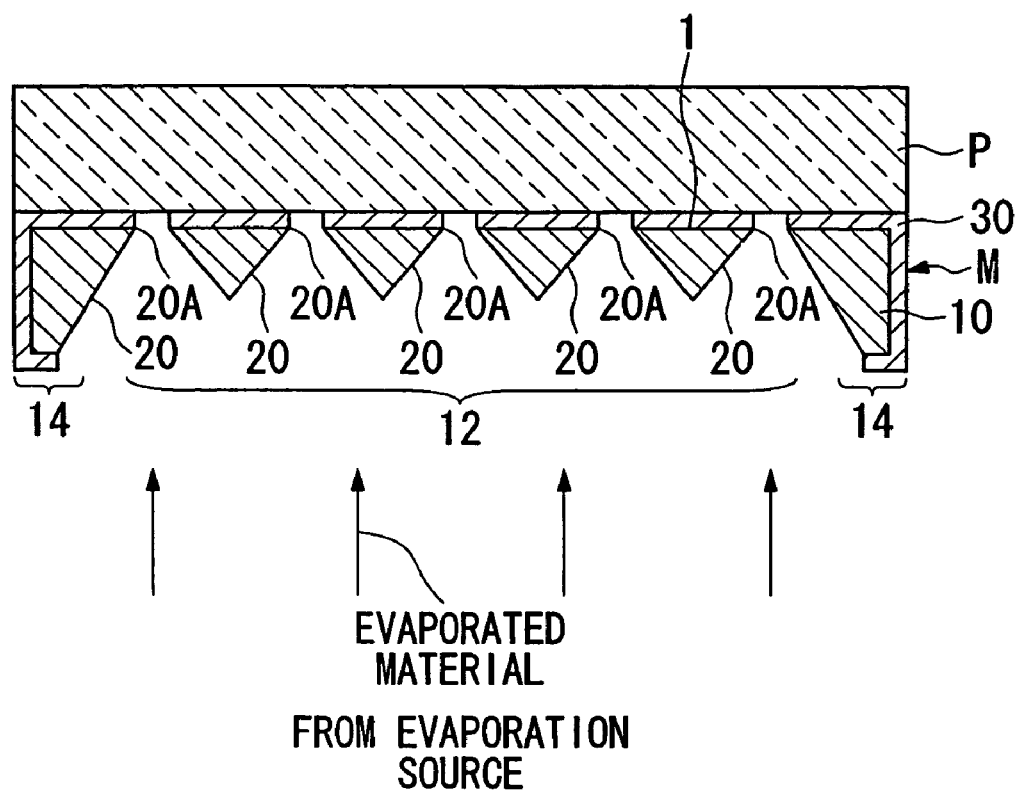
FIG. 8 illustrates a process of evaporation to an evaporation object using the mask according to the present invention.

FIG. 8 illustrates a step of evaporating an evaporation material from an evaporation source to the glass substrate P, i.e., the evaporation object, through the through-holes 20 in the mask M while making the glass substrate P to come in a close contact with the mask M. As shown in FIG. 8, the bending deformation in the mask M is corrected by the film 30, and the glass substrate P is made to come in a close contact with the mask M. Therefore, even when the size of the glass substrate P and the mask M increases, evaporation material can be satisfactorily patterned to the glass substrate P while reducing the effects of deformation and the like. By providing the thinner portion 12 to a part of the mask M, the evaporated areas can be almost restricted to the areas of the openings 20A of the mask M. The tapered through-holes 20 facilitates a further precise evaporation of the evaporation material to the glass substrate P. Furthermore, the thicker portion 14 reinforces the silicon substrate 10 which is provided the thinner portion 12.

Although the mask is illustrated as an evaporation mask in the embodiments mentioned above, the mask M can be used, for example, as a sputtering mask.

FIG. 9 is a drawing schematically illustrating a process for evaporating material for forming an organic electroluminescent display to the glass substrate P, e.g., an evaporation object, using the mask M according to the present invention.

Figure 9A:
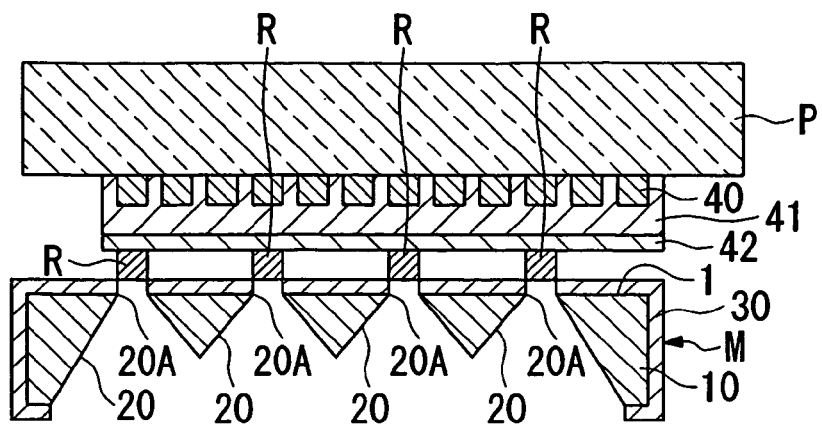
FIGS. 9A to 9D are cross-sectional views illustrating a method for manufacturing a display according to the present invention.

In FIG. 9A, switching elements, e.g., thin-film transistors, are formed above the glass substrate P, anodes 40 are provided to connect to the switching elements. A hole injection layer 41 and a hole transport layer 42 are formed to connect to the anodes 40. The upper side (first side) of the mask M according to the present invention is placed to closely contact the hole transport layer 42. Through-holes 20 (openings 20A) are provided in the thinner portion 12 of the mask M. An organic electroluminescent display formation material (light emitting layer) passes through the through-holes 20 provided in the thinner portion 12 and is disposed to a pixel region. Thus, the pixel pattern of an organic electroluminescent display is formed on the glass substrate P. The bending deformation in the thinner portion 12 for forming pixels is corrected by the film 30 which is provided on the thinner portion 12.

Then, as shown in FIG. 9A, a material R for forming a red (R) light emitting layer is evaporated on the glass substrate P while making the mask M come in a close contact with the glass substrate P (hole transport layer 42). The material R for forming a red light emitting layer is evaporated on the glass substrate P according to the through-holes 20 in the mask M (openings 20A).

Figure 9B:
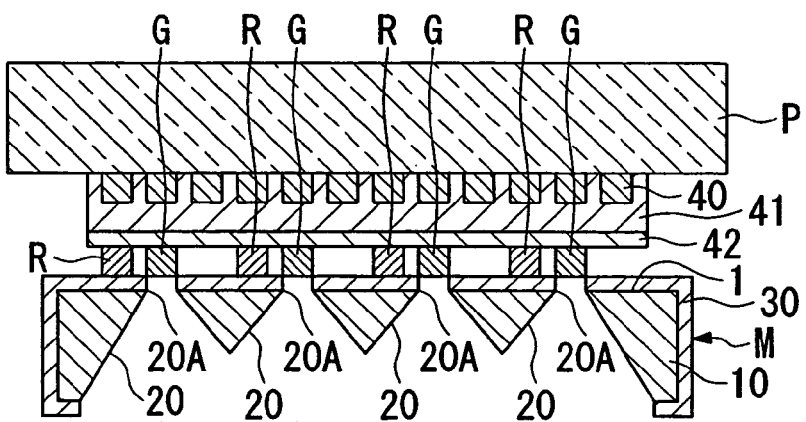

Then, as shown in FIG. 9B, the mask M is shifted with respect to the glass substrate P, or the mask M is replaced by another mask M, and a material G for forming a green light emitting layer is evaporated on the glass substrate P while making the mask M come in a close contact with the glass substrate P (hole transport layer 42). The material G for forming a green light emitting layer is evaporated on the glass substrate P according to the through-holes 20 in the mask M.

Figure 9C:
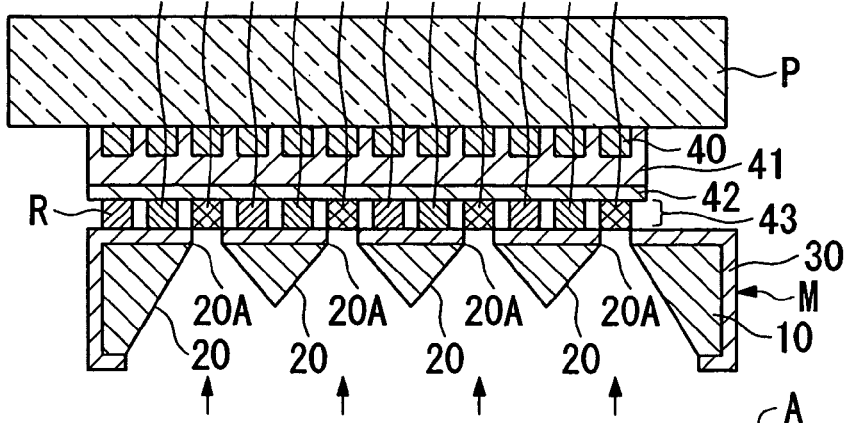

Then, as shown in FIG. 9C, the mask M is shifted with respect to the glass substrate P, alternatively, the mask M is replaced by another mask M, and a material B for forming a blue light emitting layer is evaporated on the glass substrate P while making the mask M come in a close contact with the glass substrate P (hole transport layer 42). The material B for forming a blue light emitting layer is evaporated on the glass substrate P according to the through-holes 20 in the mask M.

Thus, a light emitting layer 43 made from organic materials of red, blue and green is formed on the glass substrate P.

Figure 9D:
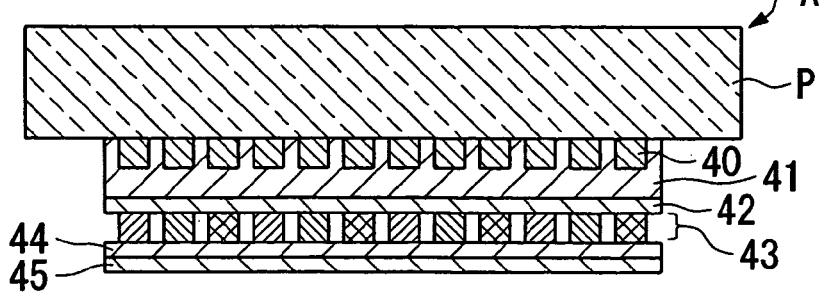

As shown in FIG. 9D, an electron transport layer 44 and a cathode 45 are formed above the light emitting layer 43, and thus an organic electroluminescent display A is formed.

In the organic electroluminescent display A according to this embodiment, light emitting from the light emitting elements having light emitting layers is taken from the substrate to the outside of the display. Examples of the material of the substrate P include transparent glass; transparent or translucent materials which can transmit light, including quartz and sapphire; and transparent synthetic resins including polyester, polyacrylate, polycarbonate, and polyether ketone; and the like. In particular, soda glass is preferably used as the material of the substrate P since soda glass is inexpensive.

In contrast, in the configuration in which emitted light is taken from the side opposing to the substrate P, an opaque material may be used for the substrate P. In this case, ceramics such as alumina, an metal sheet such as a stainless steel sheet on which an insulating treatment, such as surface oxidation, is applied, thermosetting resins, thermoplastic resins, and the like, may be used.

The above-descried anode may be made of elemental metals including aluminum (Al), gold (Au), silver (Ag), magnesium (Mg), nickel (Ni), zinc-vanadium (ZnV), indium (In), tin (Sn), and the like; compound or mixtures of the above-mentioned metals; conductive adhesives containing metal fillers. In this example, ITO (indium tin oxide) is used. Although it is preferable to form the anode using sputtering, ion plating, or vacuum evaporation, wet process coating methods such as spin coating, gravure coating and knife coating, screen printing, flexography, or the like, may be used. The material of the anode is preferably selected so that the light transmittance of the anode is 80% or higher.

The hole transport layer is formed by, for example, coevaporating carbazole polymer and triphenyl compound (TPD) to a thickness of 10 nm to 1000 nm (preferably to 100 nm to 700 nm). Various well-known materials may be used to form the hole transport layer 46, and non-limiting examples include, for example, pyrazoline derivatives, aryl amine derivatives, stilbene derivatives, triphenyl diamine derivatives, and the like. Specifically, examples of the material of the hole transport layer include materials disclosed in Japanese Unexamined Patent Applications Nos. S63-70257, S63-175860, H02-135359, H02-135361, H02-209988, H03-37992, and H03-152184. Triphenyl diamine derivatives are preferable, and among them, 4,4'-bis (N(3-methyl phenyl)-N-phenyl amino) biphenyl is particularly preferable.

Examples of the material of the hole injection layer include, for example, copper phthalocyanine (CuPc), polyphenylene vinylene which is polytetrahydrothio phenyl phenylene, 1,1-bis-(4-N,N-ditolyl amino phenyl) cyclohexane, tris-(8-hydroxyquinolinol) aluminum, and the like, and in particular, copper phthalocyanine (CuPc) is particularly preferable.

Alternatively, the hole injection layer may be formed above the anode, for example, using a liquid drop ejection method (ink jet method) in which a film is formed by ejecting a composition ink containing the material of the hole injection or hole transport layer, which is followed by dry and thermal treatments. In other words, the hole transport layer or hole injection layer is formed above the anode by ejecting the composition ink containing the material of the hole injection layer or the hole transport layer above the electrode surface of the anode, which is followed by dry and thermal treatments. For example, an ink jet head (not shown) is filled with the composition ink containing the material of the hole injection layer or the hole transport layer, and an ejection nozzle of the ink jet head is placed opposing the electrode surface of the anode. Droplets are ejected to the electrode surface from the ejection nozzle by controlling the amount of the ink while relatively shifting the ink jet head against the substrate 1. Then the ejected ink droplets are dried so that polar solvent contained in the composition ink is evaporated and the hole injection layer (hole injection layer) remains.

As the composition ink, for example, a mixture of polythiophene derivatives such as polyethylene dioxythiophene, polystyrene sulfonic acid and the like, dissolved in a polar solvent, e.g., isopropyl alcohol, may be used. The ejected ink droplets spread on the electrode surface of the anode which has been imparted to an affinity to the ink. However, the ink droplets are repelled by the upper side of the insulation layer which has been imparted to an ink repellency, and will not disposed on the upper side of the insulation layer. Therefore, even if an ink droplet lands on the upper side of the insulation, deviating from the predetermined ejection position, the upper side is not wetted by the ink droplet, and the ink droplet is repelled to flow into the anode 5.

Light emitting materials for forming the light emitting layer, fluorene polymer derivatives, (poly) paraphenylene vinylene derivatives, polyphenylene derivatives, polyfluorene derivatives, polyvinyl carbazole, polythiophene derivatives, perylene dyes, coumarine dyes, rhodamine dyes, and other low molecular organic electroluminescent display formation material which is soluble in benzene derivatives may be used.

As the electron transport layer, a metal complex compound consisting of a metal and an organic ligand may be used, and Alq3 (tris(8-quinolinolate) aluminum complex), Znq2 (bis(8-quinolinolate) zinc complex), Bebq2 (bis(8-quinolinolate) beryllium complex), Zn-BTZ (2-(o-hydroxyphenyl) benzothiazole zinc), perylene derivatives, and the like, are preferably evaporated to a thickness of between 10 nm and 1000 nm (preferably between 100 mn and 700 nm) to stack the electron transport layer.

As the cathode, any metal which has a low work function so that electrons are effectively injected the electron transport layer may be used, and the cathode is preferably made of elemental metals such as Ca, Au, Mg, Sn, In, Ag, Li, or Al, or alloys or compounds of the above-mentioned metal. In this embodiment, the cathode has a double layered structure which is made of a cathode essentially made of calcium, and a reflection layer essentially made of aluminum.

The organic electroluminescent display A of this embodiment is an active matrix display, and plural data lines and plural scan lines are provided in a grid shape. For each of the pixels which are partitioned by the data lines and the scan lines are provided in a matrix shape, the above-described light emitting elements are connected via driving TFTs such as switching transistors or driving transistors. When a driving signal is supplied via the data lines and the scan lines, electric current flows across the electrodes. A light emitting element emits light and the light transmits through the transparent substrate, and the pixel turns on. It should be noted that the present invention is not limited to active matrix displays, and is applicable to passive driving displaying elements.

A sealing member which is not shown may be provided for preventing the air from entering to the light emitting elements containing electrodes. As the material of the sealing member, transparent or translucent materials, such as glass, quartz, sapphire, synthetic resins, or the like, may be used. As a glass, for example, soda lime glass, lead alkali glass, borosilicate glass, alumino silicate glass, silica glass, and the like, may be used. As synthetic resins, transparent synthetic resins, such as polyolefin, polyester, polyacrylate, polycarbonate, polyether ketone, may be used.

Next, examples of electronic devices including the organic electroluminescent display A of the above-described embodiments will be explained.

Figure 10A:
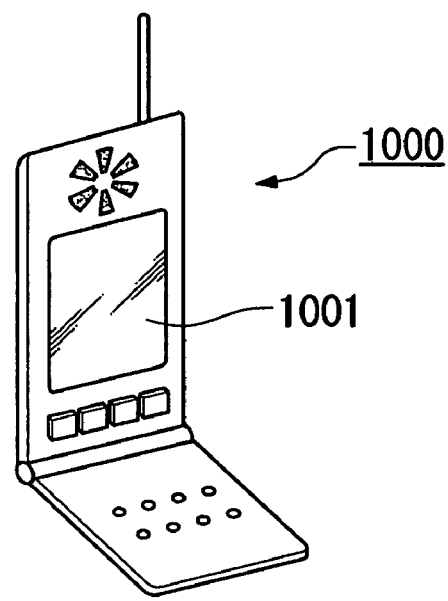
FIGS. 10A to 10C are schematic diagrams of electronic devices according to the present invention.

FIG. 10A is a perspective view showing an example of a cellular phone. In FIG. 10A, reference numeral 1000 denotes a cellular phone, and reference numeral 1001 denotes a display unit provided with the organic electroluminescent device A described above.

Figure 10B:
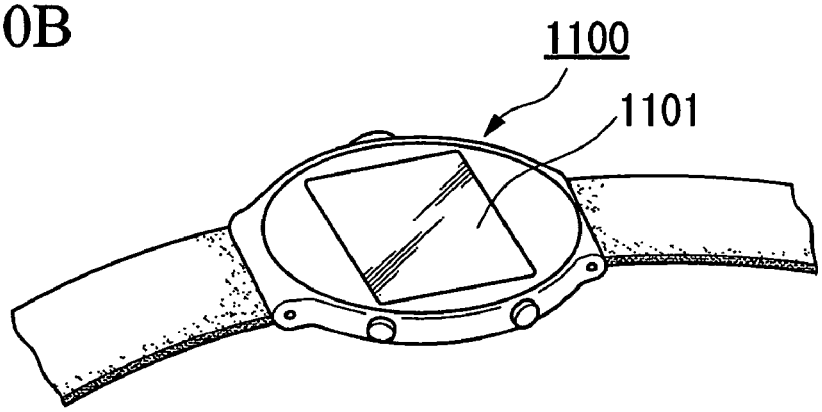
Figure 10C:
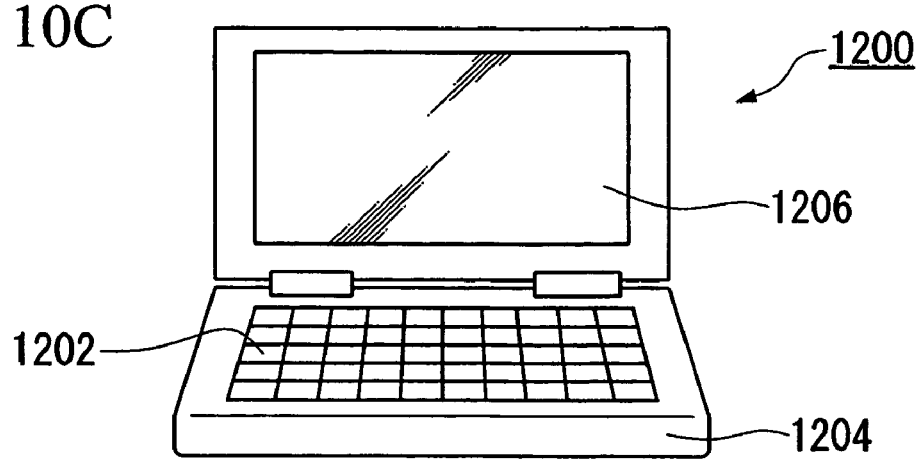

FIG. 10C is a perspective view showing an example of a wristwatch type electronic device. In FIG. 10B, reference numeral 1100 denotes a watch body and numeral 1101 denotes a display unit provided with the organic electroluminescent device A described above.

FIG. 10B is a perspective view showing an example of a portable information processing device such as a word processor and a personal computer. In FIG. 10C, reference numeral 1200 denotes an information processing unit, numeral 1202 denotes an input unit such as a keyboard, numeral 1204 denotes an information processing unit main body, and numeral 1206 denotes a display unit provided with the organic electroluminescent device A described above.

Each of the electronic devices shown in FIGS. 10A to 10C includes the organic electroluminescent display A of the above-mentioned embodiments. Thus, it is possible to provide slim and long-life electronic devices having an organic electroluminescent display.

It should be noted that the electronic device is not limited to the above-described cellular phone and the like, and the present invention may be applied to various electronic devices. Non-limiting examples of electronic devices to which the present invention can be applied include notebook computers, liquid crystal projectors, multimedia-ready personal computers (PCs) and engineering workstations (EWSs), pagers, word processors, television sets, viewfinder-type or direct viewing monitor-type video cassette recorders (VCRs), electronic organizers, electronic desk calculators, car navigation systems, POS terminals, and devices having touch panels and the like.

While preferred embodiments of the invention have been described and illustrated above, it should be understood that these are examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for manufacturing a display comprising:
   providing an evaporation object;
   evaporating a display formation material on the evaporation object using a mask including:
   a substrate having an area in which a plurality of through-holes are provided, the through holes corresponding to patterns formed to the evaporation object; and
   a film provided on at least a side of the substrate;
   wherein the film comprises a plurality of concentric film patterns, a thickness of the film pattern at an outside being smaller than a thickness of the film pattern at an inside.

2. The method for manufacturing the display according to claim 1, wherein a thickness of the film decreases from the central portion toward an outside of the substrate gradually.

3. The method for manufacturing the display according to claim 1, wherein the film is formed of silicon oxide, silicon nitride, silicon carbide, gold or chrome.

4. A method for manufacturing a display comprising:
   providing an evaporation object; and
   evaporating a display formation material on the evaporation object using a mask, the mask including:
   a substrate having an area in which a plurality of through-holes are provided, the through-holes corresponding to patterns formed to the evaporation object; and
   a film provided on at least a side of the substrate, the film preventing warping of the substrate, and the film comprises a plurality of concentric film patterns, a thickness of the film pattern at an outside being smaller than a thickness of the film pattern at an inside;

the area having a first region where the film is formed, and a second region where no film is formed, wherein a stress differs between the first region and the second region of the substrate.

5. The method for manufacturing the display according to claim 4, wherein the film comprises a material selected from a group consisting of silicon oxide, silicon nitride, and silicon carbide.

6. The method for manufacturing the display according to claim 4, wherein the substrate comprises a front side and a back side, and the film is provided on at least one of the front side and the back side of the substrate.

7. The method for manufacturing the display according claim 4, wherein the film is a metal film made of gold or chrome.

8. A method for manufacturing an organic electroluminescent display comprising:

providing an evaporation object; and evaporating an organic electroluminescent display formation material on the evaporation object using a mask including:

a substrate having an area in which a plurality of through-holes are provided, the through-holes corresponding to patterns formed to the evaporation object; and a film provided on at least a side of the substrate, the film preventing warping of the substrate, and the film comprises a plurality of concentric film patterns, a thickness of the film pattern at an outside being smaller than a thickness of the film pattern at an inside;

the area having a first region where the film is formed, and a second region where no film is formed, wherein a stress differs between the first region and the second region of the substrate.

9. The method for manufacturing the organic electroluminescent display according to claim 8, wherein the film is formed of silicon oxide, silicon nitride, silicon carbide, gold or chrome.

* * * * *